(12) United States Patent
Lee et al.

(10) Patent No.: US 9,269,777 B2
(45) Date of Patent: Feb. 23, 2016

(54) SOURCE/DRAIN STRUCTURES AND METHODS OF FORMING SAME

(71) Applicant: Taiwan Semiconductor Manufacturing Company, Ltd., Hsin-Chu (TW)

(72) Inventors: Yi-Jing Lee, Hsinchu (TW); Kun-Mu Li, Hsinchu County (TW); Chii-Horng Li, Hsinchu County (TW); Tze-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/338,448

(22) Filed: Jul. 23, 2014

(65) Prior Publication Data
US 2016/0027877 A1    Jan. 28, 2016

(51) Int. Cl.
| | |
|---|---|
| H01L 31/0328 | (2006.01) |
| H01L 31/0336 | (2006.01) |
| H01L 31/072 | (2012.01) |
| H01L 31/109 | (2006.01) |
| H01L 27/01 | (2006.01) |
| H01L 27/12 | (2006.01) |
| H01L 31/0392 | (2006.01) |
| H01L 29/165 | (2006.01) |
| H01L 29/78 | (2006.01) |
| H01L 29/08 | (2006.01) |
| H01L 29/66 | (2006.01) |
| H01L 29/06 | (2006.01) |

(52) U.S. Cl.
CPC .......... *H01L 29/165* (2013.01); *H01L 29/0692* (2013.01); *H01L 29/0847* (2013.01); *H01L29/66636* (2013.01); *H01L 29/66795* (2013.01); *H01L 29/785* (2013.01)

(58) Field of Classification Search
CPC ..................................................... H01L 29/165
USPC .................................................. 257/190, 347
See application file for complete search history.

(56) References Cited

U.S. PATENT DOCUMENTS

| | | | |
|---|---|---|---|
| 6,284,633 B1 * | 9/2001 | Nagabushnam | C23C 16/345 257/E21.2 |
| 7,335,545 B2 * | 2/2008 | Currie | H01L 21/76254 257/E21.121 |
| 8,497,177 B1 * | 7/2013 | Chang | H01L 29/66795 438/283 |
| 2008/0237572 A1 * | 10/2008 | Chui | H01L 29/155 257/14 |

* cited by examiner

Primary Examiner — David S Blum
(74) Attorney, Agent, or Firm — Haynes and Boone, LLP

(57) ABSTRACT

The present disclosure provides a semiconductor device including a gate stack disposed over a substrate, a source/drain (S/D) feature at least partially embedded within the substrate adjacent the gate stack. The S/D feature includes a first semiconductor material layer, a second semiconductor material layer disposed over the first semiconductor material layer. The second semiconductor material layer is different to the first semiconductor material layer. The S/D also includes a third semiconductor material layer disposed over the second semiconductor material layer, which includes a tin (Sn) material.

20 Claims, 11 Drawing Sheets

SOURCE/DRAIN STRUCTURES AND METHODS OF FORMING SAME

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. Although existing devices and methods of fabricating devices have been generally adequate for their intended purposes, they have not been entirely satisfactory in all respects, such as a high parasitic resistance, which reduces drive current in semiconductor device.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
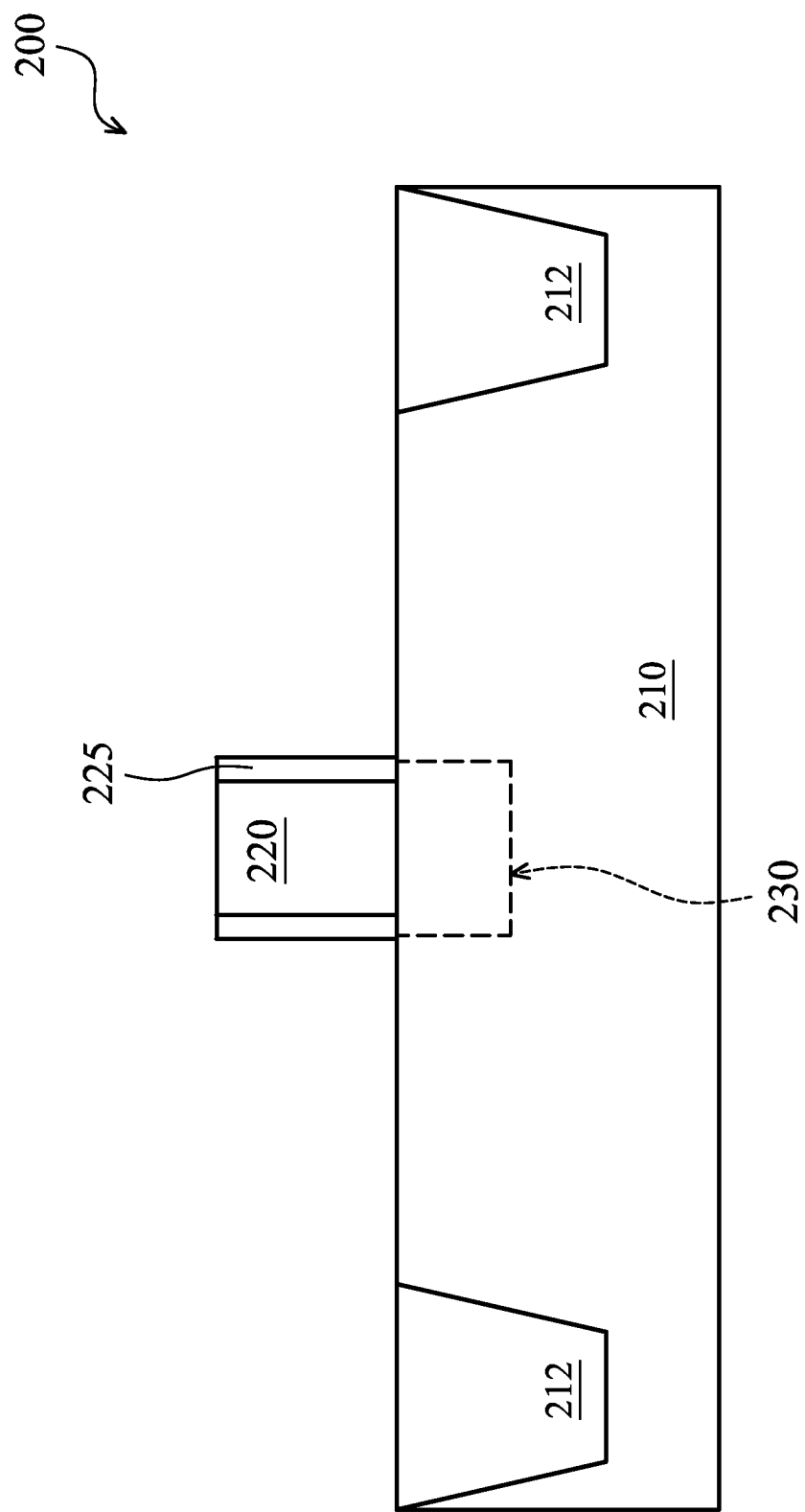
FIGS. 1, 2, 3A-3B and 4 are cross-sectional views of an example semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 4 are cross-sectional views of intermediate stages in the manufacturing of a semiconductor device 200 in accordance with some example embodiments.

FIG. 1 illustrates a cross-sectional view of an intermediate stage of the semiconductor device 200. Semiconductor device 200 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide, or combinations thereof. Possible substrates 210 also include a silicon-on-insulator (SOI) substrate. SOI substrates are fabricated using separation by implantation of oxygen (SIMOX), wafer bonding, and/or other suitable methods.

The substrate 210 may include various doped regions (not shown) depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure.

The substrate 210 also includes isolation regions 212 to isolate active regions of the substrate 210. The isolation region 212 may be formed using traditional isolation technology, such as shallow trench isolation (STI), to define and electrically isolate the various regions. The isolation region 212 comprises silicon oxide, silicon nitride, silicon oxynitride, an air gap, other suitable materials, or combinations thereof. The isolation region 212 is formed by any suitable process. As one example, the formation of an STI includes a photolithography process, an etch process to etch a trench in the substrate (for example, by using a dry etching and/or wet etching), and a deposition to fill in the trenches (for example, by using a chemical vapor deposition process) with one or more dielectric materials.

The substrate 210 includes a gate stack 220 over the substrate 210 and a gate spacer 225 along sidewalls of the gate stack 220. The gate stack 220 may include a dielectric layer and a gate electrode layer. The gate stack 220 can be formed by a procedure including deposition, photolithography patterning, and etching processes. The deposition processes may include chemical vapor deposition (CVD), physical vapor deposition (PVD), atomic layer deposition (ALD), or other suitable processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods.

In present embodiment, the gate stack 220 is a dummy gate stack and is replaced later by a high-k/metal gate (HK/MG). The dummy gate stack 220 may include the dielectric layer and the polysilicon layer.

The gate spacers 225 include a dielectric material such as silicon oxide. Alternatively, the gate spacers 225 may include silicon nitride, silicon carbide, silicon oxynitride, or combinations thereof. The gate spacers 225 may be formed by depositing a dielectric material over the gate stack 220 and then anisotropically etching back the dielectric material. A region locates underneath the gate stack 220 in the substrate 210 is referred to as a gate region 230.

Figure 2:
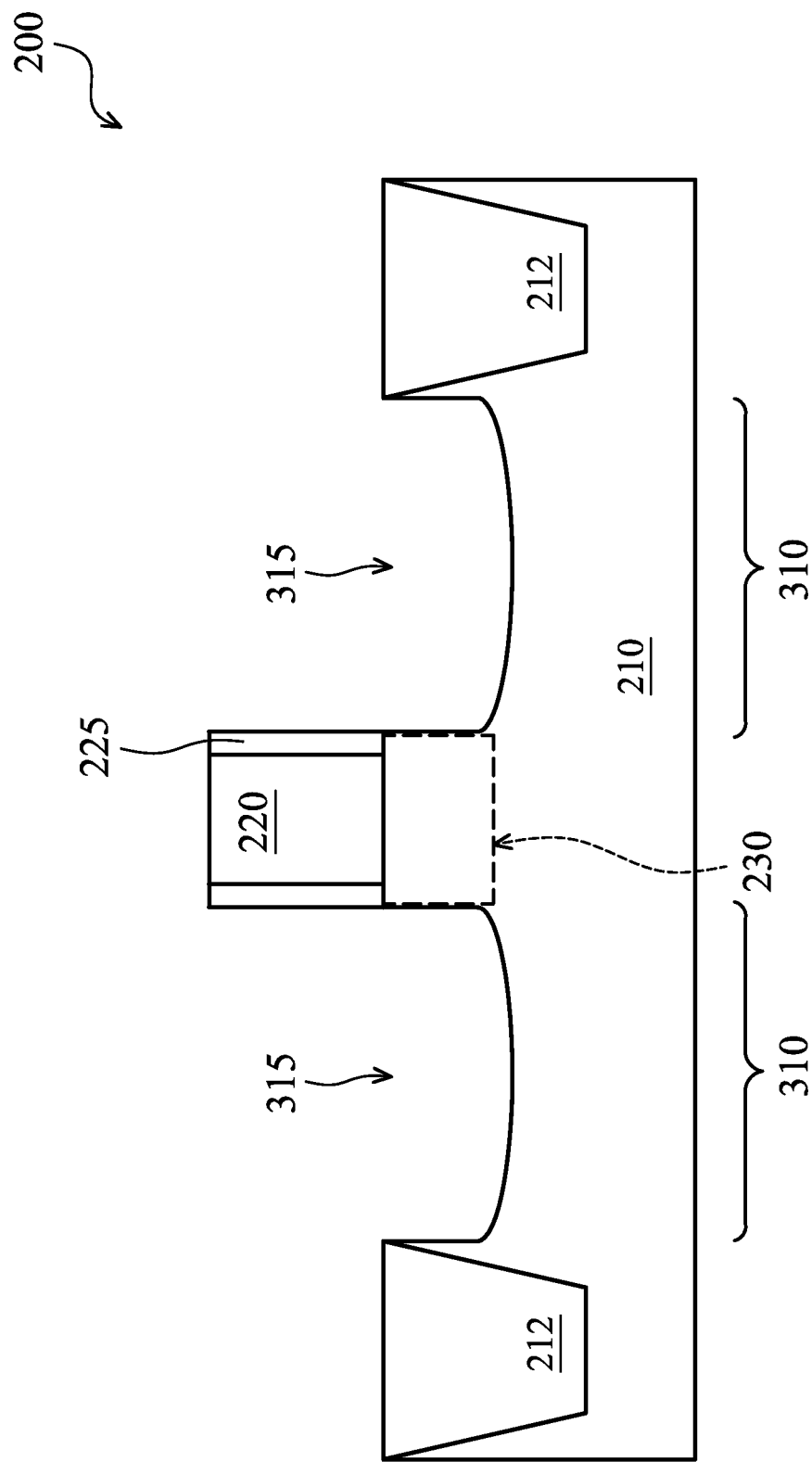

FIG. 2 illustrates a subsequent stage in manufacturing semiconductor device 200. Specifically, FIG. 2 shows recesses 315 (or S/D recesses) being formed on either side of the gate stack 220. The recesses 315 are formed by removing portions of the substrate 210 at either side of the gate stack 220. In the present embodiment, the recesses 315 are formed in source/drain (S/D) regions 310, such that the gate stack 220 interposes the recesses 315.

FIG. 3 illustrates S/D features 410 formed in recesses 315 in the S/D region 310. The S/D feature 410 may include germanium (Ge), silicon (Si), gallium arsenide (GaAs), aluminum gallium arsenide (AlGaAs), silicon germanium (SiGe), gallium arsenide phosphide (GaAsP), silicon germanium tin (SiGeSn), and/or other suitable materials. In the present embodiment, the S/D feature 410 includes multiple semiconductor material layers, such that a first semiconductor material layer 412 partially fills in the S/D recesses 315, a second semiconductor material layer 414 is formed over top of the first semiconductor material layer 412 and a third semiconductor material layer 416 is formed over top of the second semiconductor material layer 414. In present embodiment, the first semiconductor material layer 412 is completely embedded in the substrate 210. The first semiconductor material layer 412 physically contacts the second semiconductor material layer 414 and the third semiconductor material layer 416 physically contacts the second semiconductor material layer 414.

In the present embodiment, the first semiconductor material layer 412 includes epitaxially grown $SiGe_{x_1}$. Here $x_1$ represents Ge composition in atomic percent and it is in a range of about 10% to about 30%. A concentration of Ge in the first semiconductor material layer 412 may be constant, or in a grading manner (from a bottom to a top of the first semiconductor material layer 412), such that it changes from about 10% to about 15%. The first semiconductor material layer 412 has a first thickness $t_1$, which is in a range of about 5 nm to about 30 nm.

In the present embodiment, the second semiconductor material layer 414 includes epitaxially grown $SiGe_{x_2}$. Here $x_2$ represents Ge composition in atomic percent and it is in a range of about 30% to about 100%. Alternatively, the second semiconductor material layer 414 includes $SiGe_{x_3}Sn_y$ layer deposited over the $SiGe_{x_1}$ layer 412. Here $x_3$ represents Ge composition in atomic percent and it is in a range of about 85% to about 100% and y represents Sn composition in atomic percent and it is in a range of about 1% to about 10%. The second semiconductor material layer 414 serves as a strain boost layer to induce a proper strain to the gate region 230. With a large lattice match of Sn to Ge, or to Si, Sn based second semiconductor material layer 414 provides a more effective stressor. A concentration of Ge in the second semiconductor material layer 414 may be constant, or in a grading manner (from a bottom to a top of the second semiconductor material layer 414), such as changing from about 35% to about 70%. In the present embodiment, $x_1$ is higher than $x_2$ to configure the first $SiGe_{x_1}$ layer 412 as a buffer layer between the Si substrate 210 and the second $SiGe_{x_2}$ layer 414. The second semiconductor material layer 414 has a second thickness $t_2$, which is in a range of about 20 nm to about 60 nm.

In the present embodiment, the third semiconductor material layer 416 includes epitaxially grown Sn based semiconductor materials, such as $GeSn_z$, $SiGeSn_z$, $SiGeSn_zB$, and/or $GeSn_zB$. Here z represents Sn composition in atomic percent and it is in a range of about 1% to about 30%. The third semiconductor material layer 416 has a third thickness $t_3$, which is in a range of about 5 nm to about 30 nm. The third semiconductor material layer 416 serves as a low resistivity layer for S/D contacts to be formed later. Also, the third semiconductor material layer 416 serves as a capping layer for the second semiconductor material layer 414 to reduce inter-diffusion and a strain enhance layer to induce strain to the gate region 230. By varying concentrations of Sn and B, a proper low resistivity and high strain stress can be achieved. In one example, a concentration of Sn is chosen to be one order lower than a concentration of B.

Figure 4:
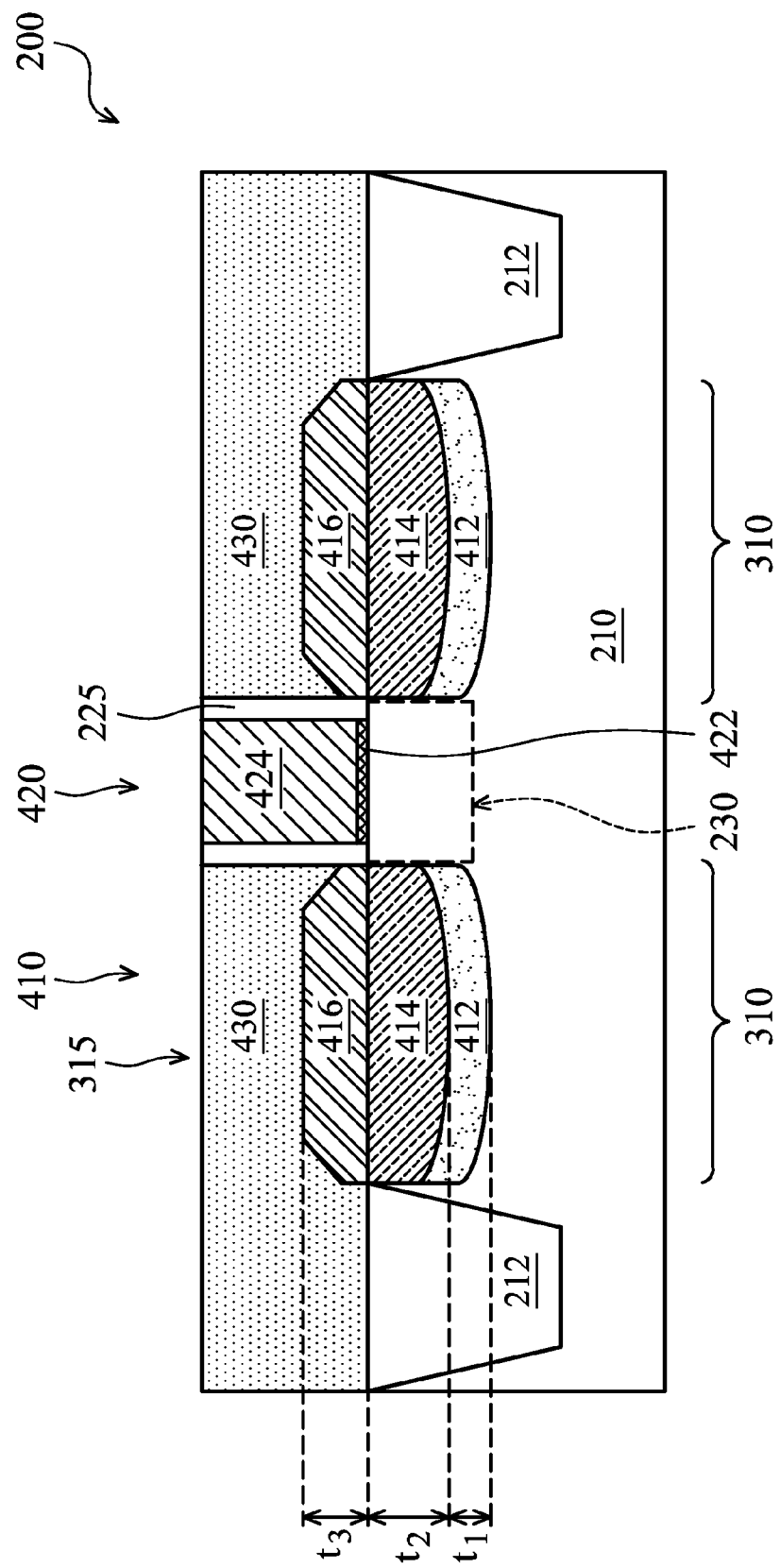

FIG. 4 illustrates a high-k/metal gate (HK/MG) 420, replacing the dummy gate stack 220, and an interlayer dielectric (ILD) 430 disposed over the substrate 210, including between the HK/MGs 420. The HK/MG 420 include gate dielectric layer 422 and gate electrode 424 over the gate dielectric. The gate dielectric layer 422 may include an interfacial layer (IL) and a HK dielectric layer. The IL includes oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The MG electrode 424 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 420 may include Ti, Ag, Al, TiAlN, TaC, TaCN, TaSiN, Mn, Zr, TiN, TaN, Ru, Mo, Al, WN, Cu, W, any suitable materials or a combination thereof.

The ILD layer 430 may include silicon oxide, oxynitride or other suitable materials. The ILD layer 430 may include a single layer or multiple layers. The ILD layer 430 is formed by a suitable technique, such as CVD, ALD and spin-on (SOG). A chemical mechanical polishing (CMP) process may be performed to remove excessive ILD layer 430 and planarize the top surface of the ILD layer 430.

FIGS. 5, 6 and 7A-7B are perspective views and cross-sectional views of intermediate stages in the manufacturing of a FinFET device 500 in accordance with some exemplary embodiments. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 5:
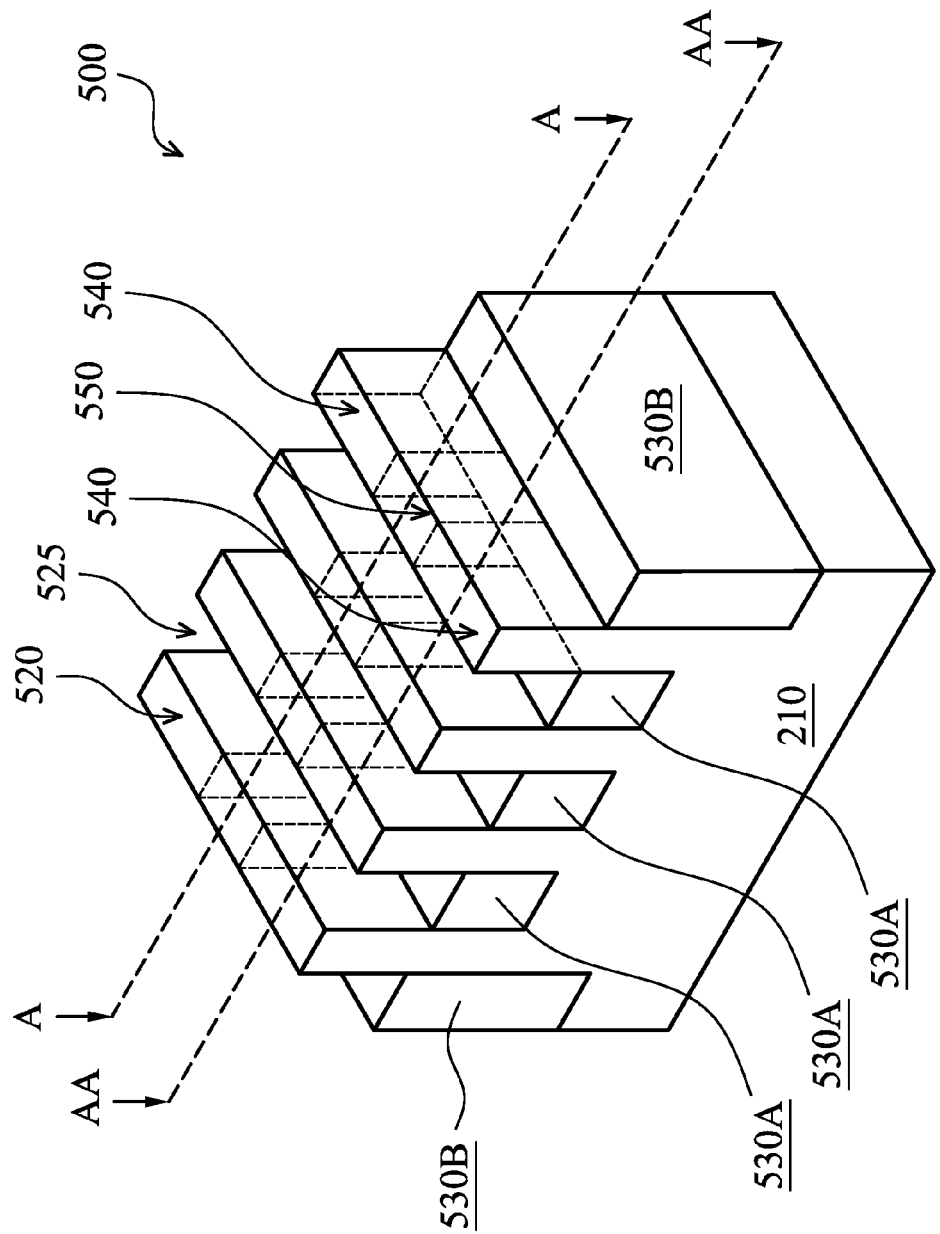
FIG. 5 is a diagrammatic perspective view of an example fin-like field-effect transistor (FinFET) device in accordance with some embodiments.

FIG. 5 illustrates a perspective view of an intermediate structure in the manufacturing of FinFET device 500. In that regard, FinFET device 500 includes the substrate 210. A fin 520 and trenches 525 are formed in the substrate 210. In some embodiments, the substrate 210 includes more than one fin 520 and trench 525. The fins 520 and trenches 525 are formed by any suitable process including various deposition, photolithography, and/or etching processes. As an example, the fins 520 and trenches 525 are formed by patterning and etching a portion of the substrate 210.

Various isolation regions 530 are formed by filling in the trenches 525 with a dielectric layer. The isolation regions 530 are formed similarly in many respects to the isolation region 212, discussed above in association with FIG. 1. In the present embodiment, the isolation regions 530 include two subset isolation regions, a first subset of isolation region 530A and a second subset of isolation region 530B. The second subset of isolation regions 530B is substantially deeper and wider than the first subset of isolation regions 530A. In one embodiment, a top surface of the first subset of isolation region 530A is in the same horizontal level of a top surface of the second subset of isolation region 530B. Between two second subset of isolation regions 530B, there is one or more first subset of isolation region 530A and multiple fins 520. The fins 520 are separated to each other by the isolation regions 530. The top surface of the isolation region 530A is below a top surface of fins 520 to expose an upper portion of fins 520.

Referring also to FIG. 5, in present embodiment, a portion of the fin 520 is defined as source/drain regions 540 while another portion is defined as a gate region 550. The source/drain regions 550 are separated by the gate region 550.

Figure 6:
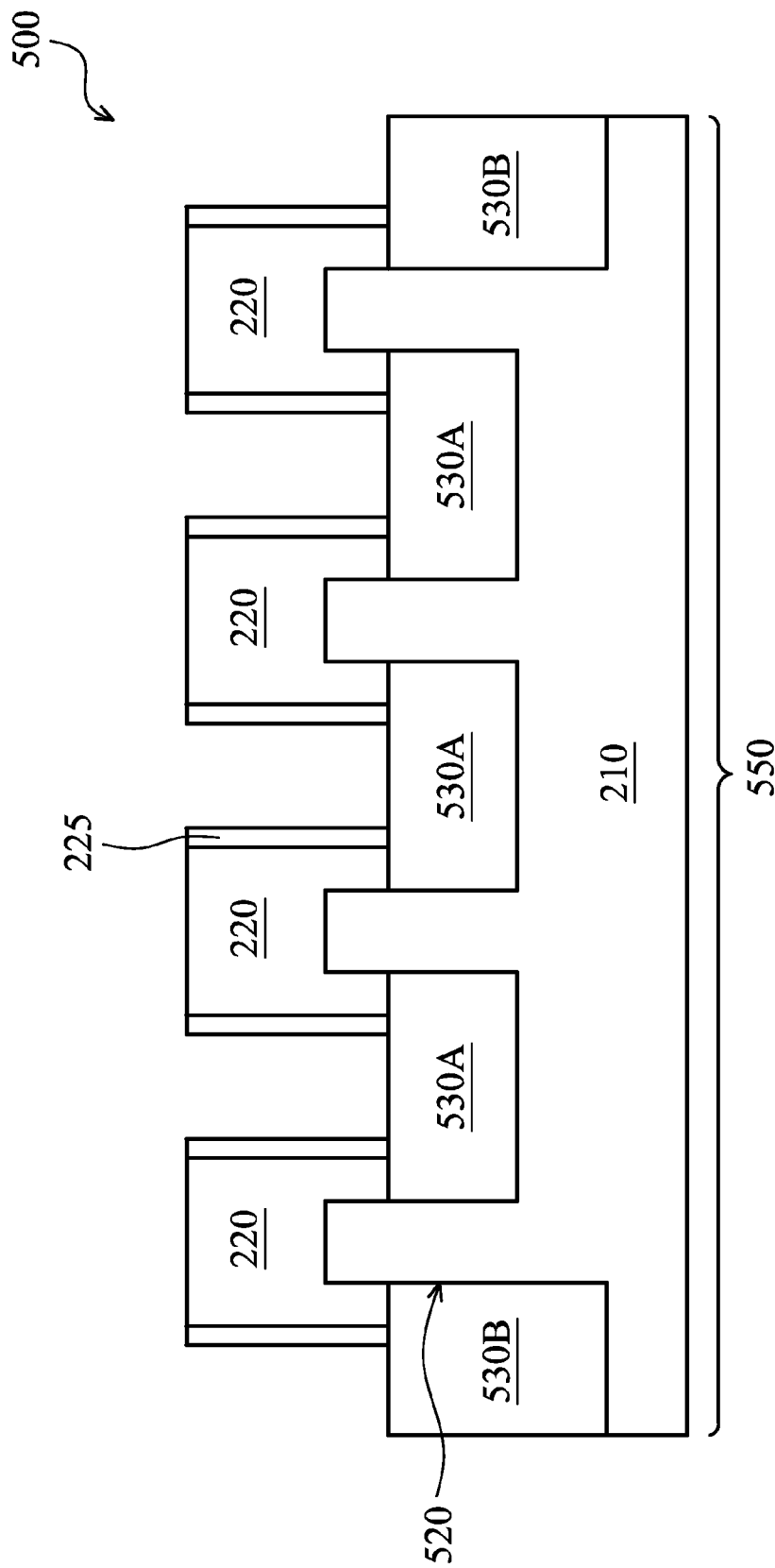
FIG. 6 is a cross-sectional view of an example FinFET device along the line A-A in FIG. 5.

FIG. 6 illustrates dummy gate stack 220 formed in the gate region 550, including wrapping over the upper portion of the fin 520. The dummy gate stack 220 may include a dielectric layer and a polysilicon layer.

Figure 7A:
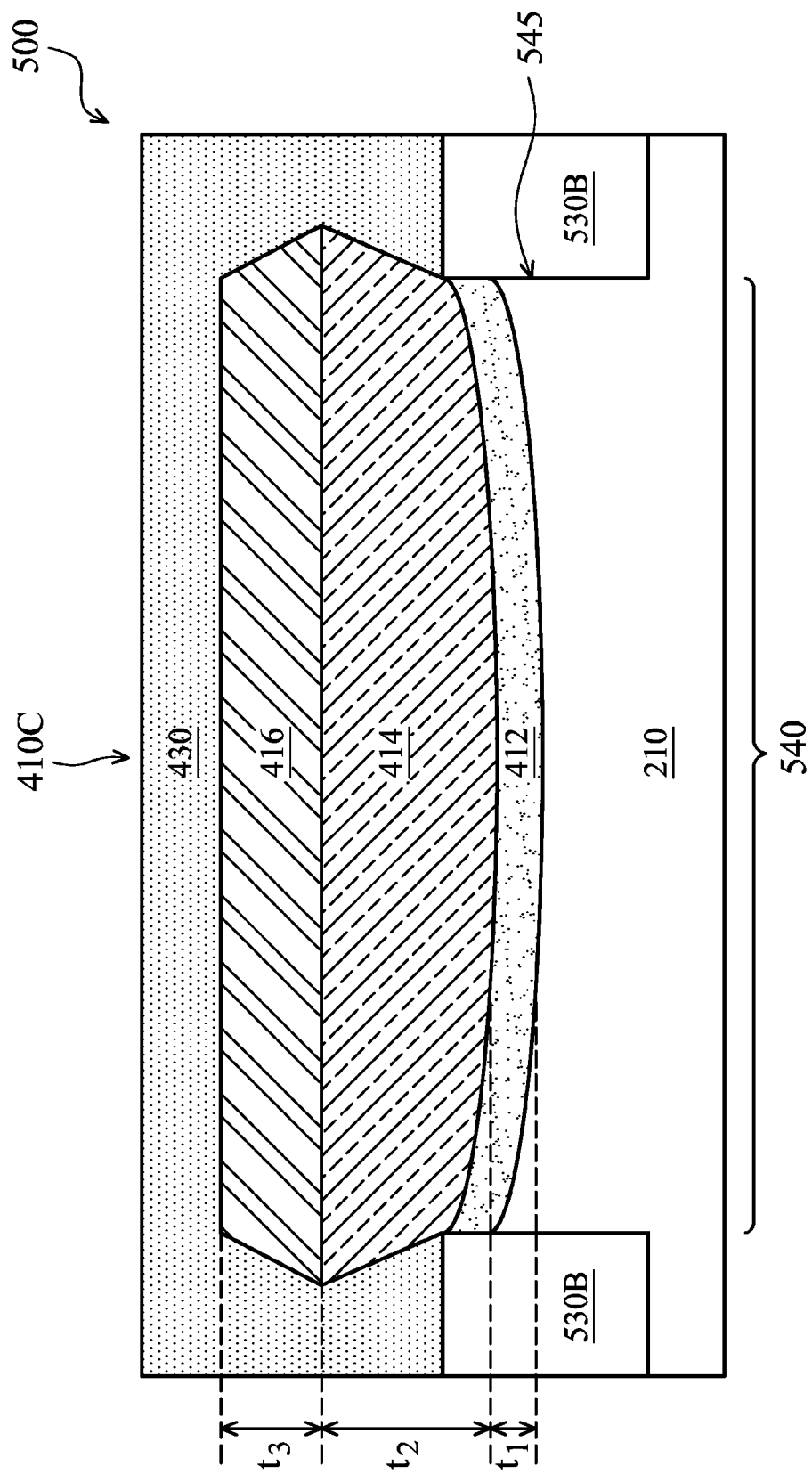
FIG. 7A is a cross-sectional view of an example FinFET device along the line AA-AA in FIG. 5.

FIG. 7A illustrates a cross-section view of the S/D feature 410 formed in the S/D region 540. In the present embodiment, a common S/D mesa 545 is formed by removing individual fins 520 and the first subset of isolation region 530A between two second subset of isolation regions 530B in the S/D region 540. The S/D feature 410 is then formed over the common S/D mesa 545. Thus, the S/D feature 410 is a single S/D feature (referred to as a crown-S/D feature 410C), which induces stress to multiple gate regions. With a large volume, the crown-S/D feature 410C may enhance strain effect. The crown-S/D feature 410C includes the first semiconductor material layer 412 disposed over the common S/D mesa 545, the second semiconductor material layer 414 disposed over the first semiconductor material layer 414 and the third semiconductor material layer 416 disposed over the second semiconductor material layer 414. The first semiconductor material layer 412 has the first thickness $t_1$, the second semiconductor material layer 414 has the second thickness $t_2$ and the third semiconductor material layer 416 has the third thickness $t_3$. In one embodiment, the first semiconductor material layer 412 is completely embedded in the substrate 210. The first semiconductor material layer 412 physically contacts the second semiconductor material layer 414 and the third semiconductor material layer 416 physically contacts the second semiconductor material layer 414.

Figure 7B:
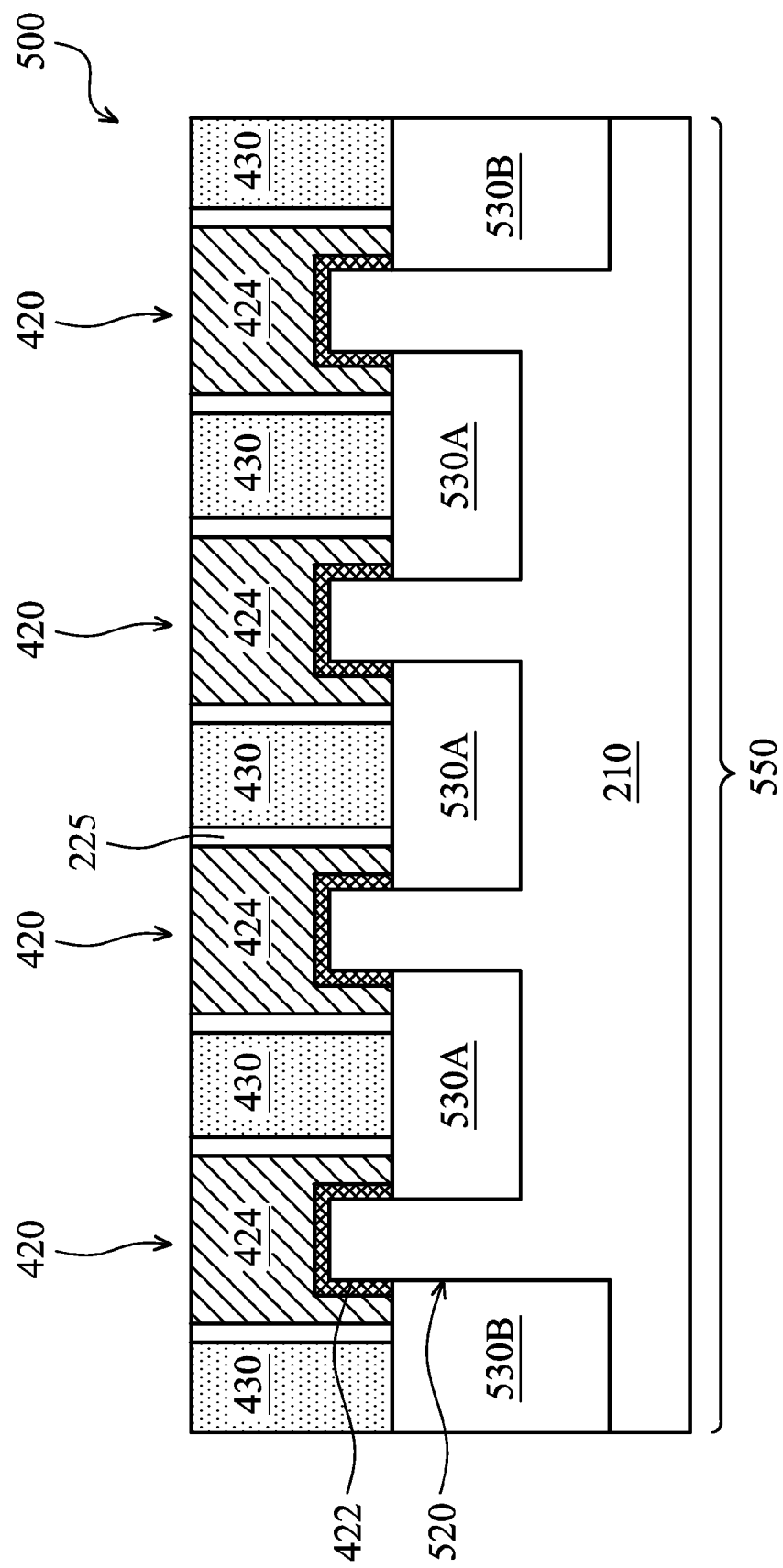
FIG. 7B is a cross-sectional view of an example FinFET device along the line A-A in FIG. 5.

FIG. 7B illustrates a cross-section view of the HK/MGs 420 replace the dummy gate stack 220 in the gate region 550, including wrapping over the upper portion of the fin 520. The HK/MG 420 include gate dielectric layer 422 and gate electrode 424 over the gate dielectric. The gate spacers 225 are disposed along the HK/MG 430. The interlayer dielectric (ILD) 430 is disposed over the isolation regions 530, including between each of the HK/MGs 420.

The FinFET device 500 may undergo CMOS or MOS technology processing to form various features and regions known in the art.

Figure 8:
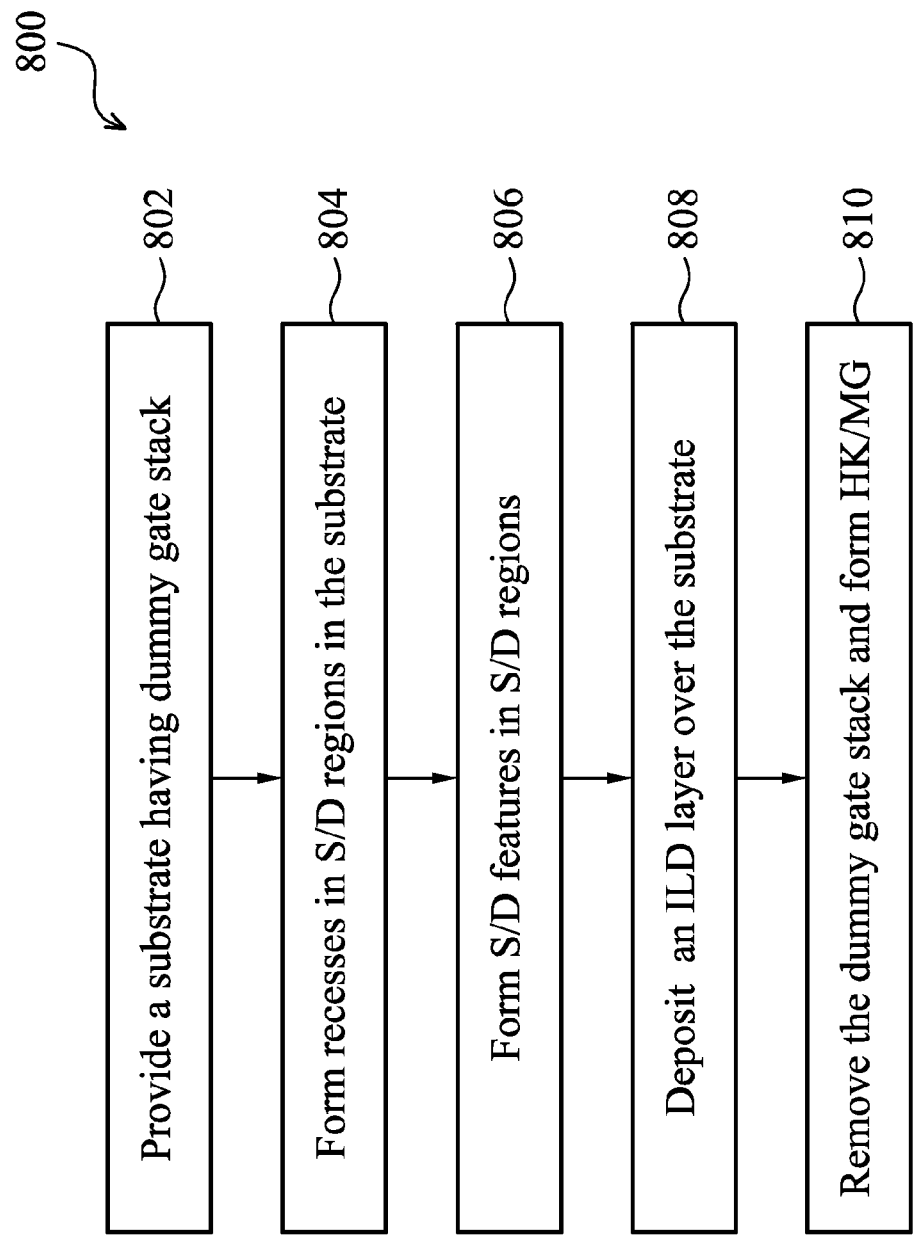
FIG. 8 is a flow chart of an example method for fabricating a semiconductor device in accordance with some embodiments.

The present disclosure also provides various methods for fabricating a semiconductor device. FIG. 8 is a flowchart of a method 800 for fabricating the semiconductor device 200 (in FIG. 4 in the present embodiment). Referring to FIGS. 8 and 1, the method 800 starts at step 802 by providing the substrate 210 with the dummy gate stack 220 and the gate spacer 225 along sidewalls of the dummy gate stack 220.

Referring to FIGS. 8 and 2, the method 800 proceeds to step 804 by forming recesses 315 in the S/D regions at either sides of the dummy gate stack 220. The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. The etching process may include a multiple-step etching to gain etch selectivity, flexibility and desired etch profile.

Figure 3A:
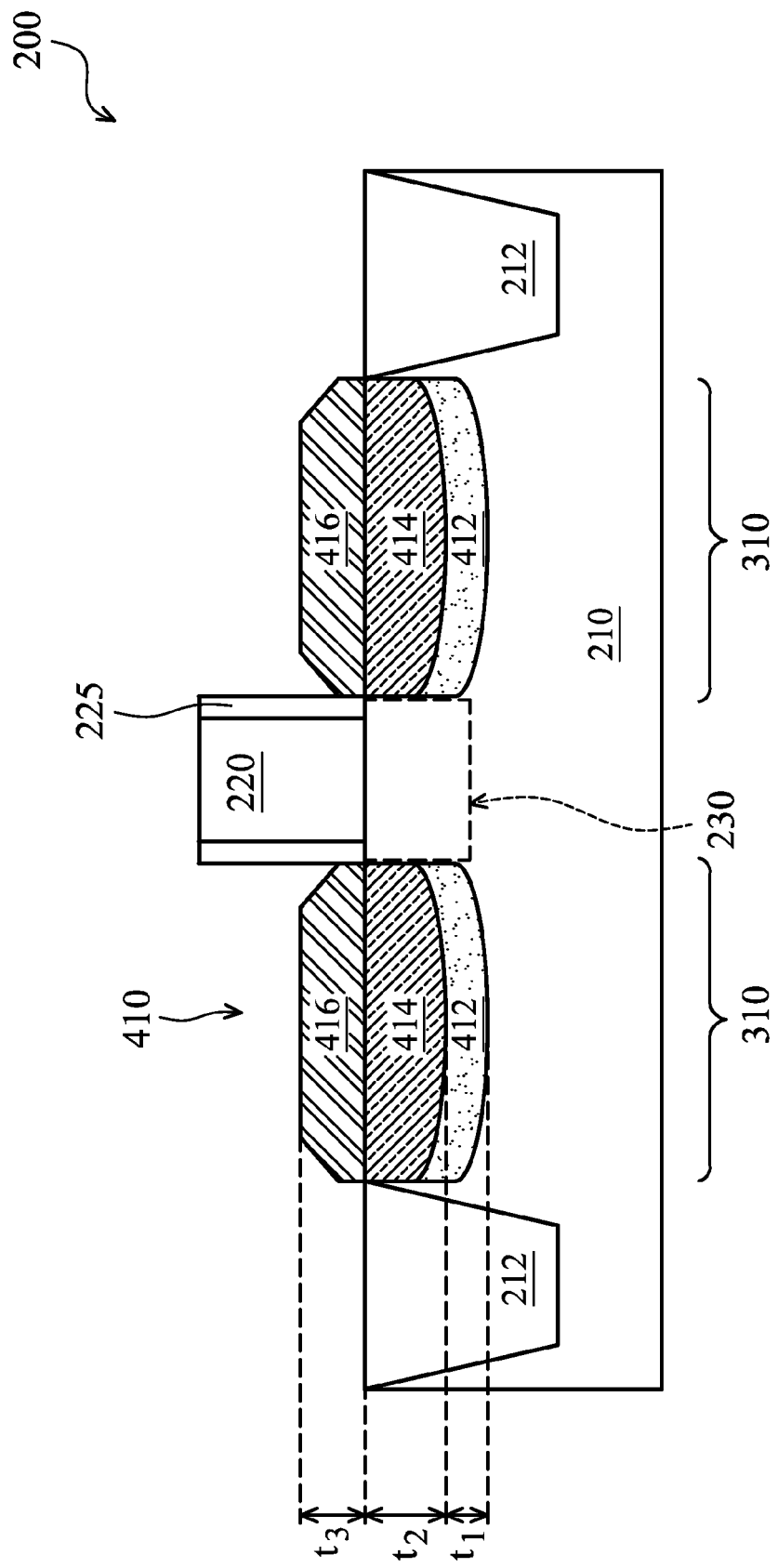

Referring to FIGS. 8 and 3A, the method 800 proceeds to step 806 by forming S/D features 410 over the recesses 315. The S/D features 410 are formed by epitaxially growing the first, second and third semiconductor material layers, 412, 414 and 416, on the recesses 315. The epitaxial processes include CVD deposition techniques (e.g., vapor-phase epitaxy (VPE) and/or ultra-high vacuum CVD (UHV-CVD)), molecular beam epitaxy, and/or other suitable processes. The S/D features 410 may be formed by one or more epitaxy or epitaxial (epi) processes. The S/D features 410 may be in-situ doped during the epi process. For example, the epitaxially grown SiGe source/drain features 410 may be doped with boron; and the epitaxially grown Si epi source/drain features 410 may be doped with carbon to form Si:C source/drain features, phosphorous to form Si:P source/drain features, or both carbon and phosphorous to form SiCP source/drain features. Alternatively, the S/D features 410 are not in-situ doped, an implantation process (i.e., a junction implant process) is performed to dope the S/D features 410, such as GeSnz, SiGeSnz, SiGeSnzB, or GeSnzB. For example, a Sn implantation is performed with Sn dopant concentration in a range from about $5 \times 10^{14}/cm^3$ to about $2 \times 10^{16}/cm^3$. One or more annealing processes may be performed to activate source/drain epitaxial feature. The annealing processes comprise rapid thermal annealing (RTA) and/or laser annealing processes.

Figure 3B:
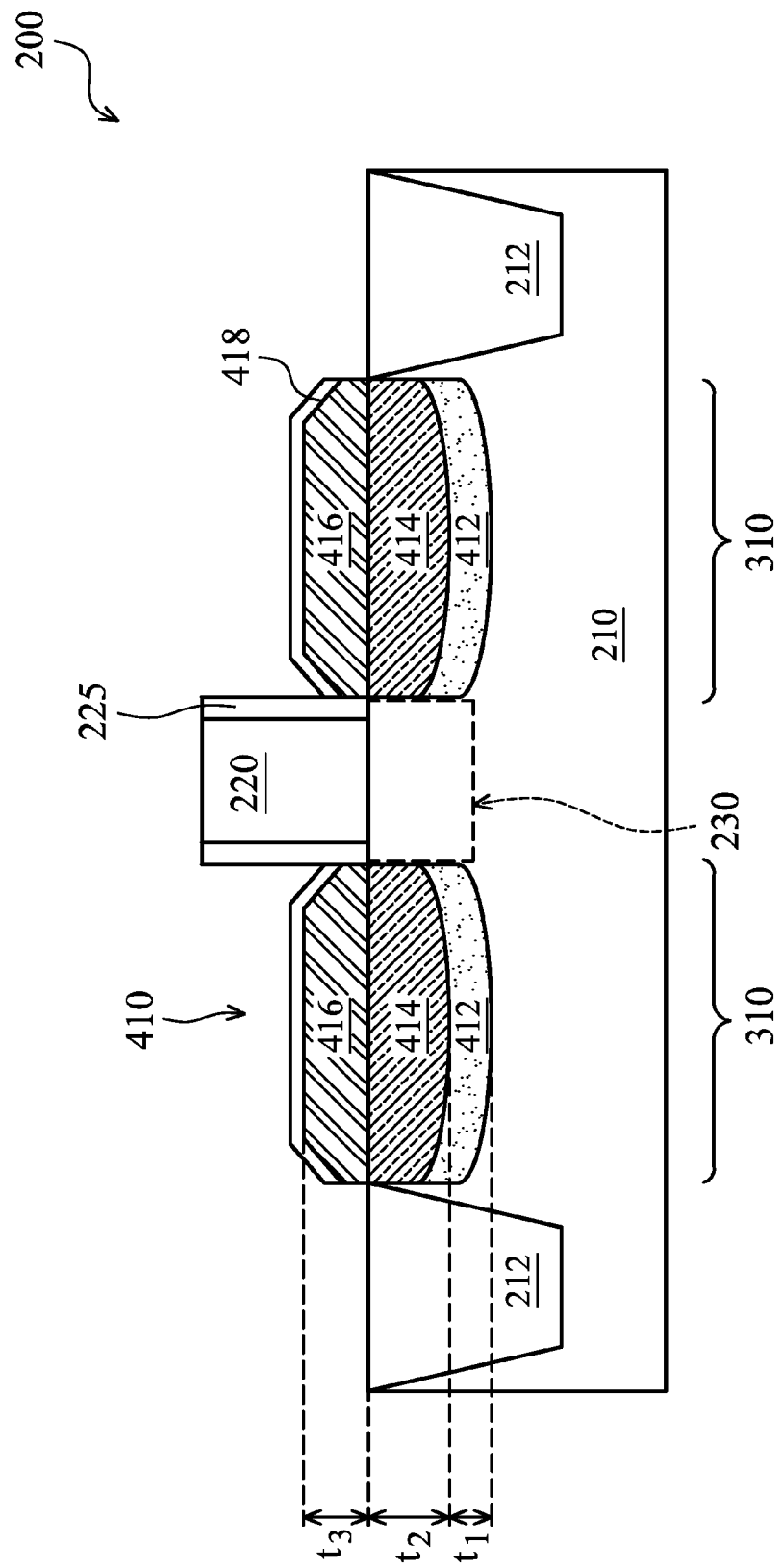

In one embodiment, a fourth semiconductor material layer 418 is deposited over the third semiconductor material layer 416 by epitaxial process, as shown in FIG. 3B. The fourth semiconductor material layer 418 serves as a sacrificial layer to prevent a loss of the third semiconductor material layer 416 during subsequent process, such as wet/dry cleaning processes. The fourth semiconductor material layer 418 also serves as a capping layer to prevent segregation among the first, second and third semiconductor material layers, 412, 414 and 416, respectively. The fourth semiconductor material layer 418 may include $SiGe_{x_3}$ layer. Here $x_3$ represents Ge composition in atomic percent and it is in a range of 0% to 40%. The fourth semiconductor material layer 418 has a thickness in a range of 0.5 nm to 15 nm.

In one embodiment, only the first and second semiconductor material layers, 412 and 414, are formed in the recesses 315 at this step and the third (as well as the fourth) semiconductor material layer 416 (and 418) is formed at a later step, which will be described later.

Referring to FIGS. 8 and 4, the method 800 proceeds to step 808 by depositing the ILD layer 430 over the substrate 210, including between the dummy gate stacks 220. The ILD layer 430 is formed by a suitable technique, such as CVD, ALD and spin-on (SOG). A chemical mechanical polishing (CMP) process may be performed to remove excessive ILD layer 430 and planarize the top surface of the ILD layer 430.

Referring also to FIGS. 8 and 4, the method 800 proceeds to step 810 by replacing the dummy gate stack 220 with the HK/MG 420. First, the dummy gate stacks 220 are removed to form a gate trench. In one embodiment, the dummy gate stacks 220 are removed by a selective wet etch, or a selective dry etch. In another embodiment, the dummy gate stack 220 are removed by lithography patterning and etching processes. The gate dielectric layer 422 is deposited over the gate trench. In one embodiment, the gate dielectric layer 422 may include the interfacial layer (IL) and the HK dielectric layer. The IL may be deposited by a suitable method, such as atomic layer deposition (ALD), CVD, thermal oxidation or ozone oxidation. The HK dielectric layer is deposited on the IL by a suitable technique, such as ALD, CVD, metal-organic CVD (MOCVD), physical vapor deposition (PVD), other suitable technique, or a combination thereof. The MG electrode 424 may be formed by ALD, PVD, CVD, or other suitable process. A CMP process may be performed to remove excessive HK dielectric layer 422 and the MG electrode 424.

As mentioned previously, in one embodiment, the third (as well as the fourth) semiconductor material layer 416 of the S/D feature 410 is formed after forming the HK/MG 420. The third the third (as well as the fourth) semiconductor material layer 416 may be formed by proper processes including patterning, etching, deposition and implantation.

Additional operations may be implemented before, during, and after the method 800, and some operations described above may be replaced or eliminated for other embodiments of the method 800.

Figure 9:
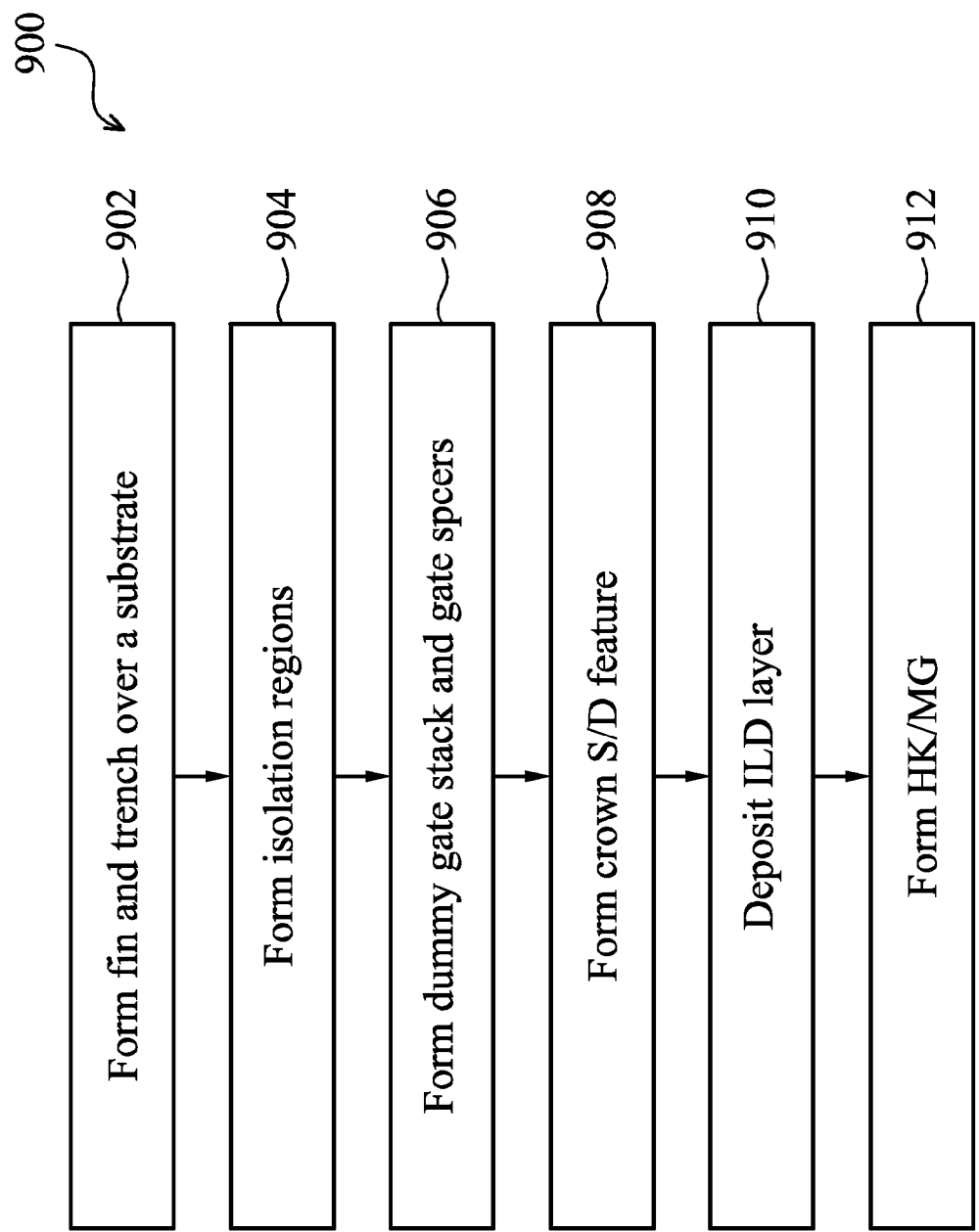
FIG. 9 is a flow chart of another example method for fabricating a FinFET device in accordance with some embodiments.

FIG. 9 is a flowchart of another example method 900 for fabricating a FinFET device (the FinFET device 500 in FIGS. 7A and 7B in the present embodiment). Referring to FIGS. 9 and 5, the method 900 starts at step 902 by forming fins 520 and trenches 525 over the substrate 210 by using proper procedures, such as a combination of photolithography and etching. Additionally, a hard mask layer may be deposited over the substrate 210 prior to patterning and etching processes. The hard mask layer includes silicon oxide, silicon nitride, silicon oxynitride, or any other suitable dielectric material, formed by thermal oxidation, chemical oxidation, ALD, or any other appropriate method. The hard mask is patterned and the substrate 210 is then etched through the patterned hard mask to form fins 520 and trenches 525.

Referring also to FIGS. 9 and 5, the method 900 proceeds to step 904 by forming the isolation regions 530A and 530B between fins 520 over the substrate 210. In the present embodiment, for forming the second subset isolation region 530B, a respective subset of the trenches 525 are etched deeper by procedures of lithography and etching. Trenches 525 are then filled with one or more dielectric material by suitable techniques, such as CVD, spin-on deposition. The dielectric material includes silicon oxide, silicon nitride, silicon oxynitride, or other suitable materials, or combinations thereof.

The dielectric material is then recessed to form the isolation regions, 530A and 530B, and expose the upper portion of the fins 520. The recess process may include a chemical etch process, for example, using hydrofluoric acid (HF) and ammonia (NH3) or nitrogen trifluoride (NF3) and ammonia (NH3), reaction gas either with or without plasma. Alternatively, the recess process may include a dry etch. The etching selectively removes the dielectric material but does not substantially etch the fins 520.

Referring FIGS. 9 and 6, the method 900 proceeds to step 906 by forming the dummy gate stack 220 and the gate spacer 225 in the gate region 550. The dummy gate stack 220 is formed by any suitable process or processes. For example, the gate stack 220 can be formed by a procedure including depositing, photolithography patterning, and etching processes. The deposition processes include CVD, PVD, ALD, other suitable methods, and/or combinations thereof. The etching processes include dry etching, wet etching, and/or other etching methods (e.g., reactive ion etching). The dielectric layer includes silicon oxide, silicon nitride, or any other suitable materials. Typical formation methods for the gate spacers 225 include depositing a dielectric material over the dummy gate stack 220 and then anisotropically etching back the dielectric material. The etching back process may include a multiple-step etching to gain etch selectivity, flexibility and desired overetch control.

Referring to FIGS. 9 and 7A, the method 900 proceeds to step 908 by forming crown-S/D features 410C in the S/D region 540. In the present embodiment, the common mesa 545 is formed by recessing individual fins 520 and the first subset of isolation regions 530A between two second subset of isolation regions 530B. The recessing process may include dry etching process, wet etching process, and/or combination thereof. The recessing process may also include a selective wet etch or a selective dry etch. The recessing process may include multiple etching processes. The S/D features 410 are then formed on the common mesa 545. The formation of the crown-S/D features 410D is similar in many respects to those discussed above in steps 806 of the method 800. In one embodiment, the fourth semiconductor material layer 418 is deposited over the third semiconductor material layer 416 by epitaxial process (not shown).

Referring also to FIGS. 9 and 7A, the method 900 proceeds to step 910 by depositing the ILD layer 430 over the substrate 210, which is which are similar in many respects to those discussed above in steps 808 of the method 800.

Referring to FIGS. 9 and 7B, the method 900 proceeds to step 912 by forming HK/MGs 420, which is which are similar in many respects to those discussed above in steps 810 of the method 800. The dummy gate stack 220 is removed to form a gate trench and the upper portion of the fins 520 are exposed in the gate trench. The HK/MGs 420 are formed in the gate trench, including wrapping over the upper portion of the fins 520.

Additional operations may be implemented before, during, and after the method 900, and some operations described above may be replaced or eliminated for other embodiments of the method 900.

The semiconductor device 200 and the FinFET 500 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers S/D features employing a Sn-based low resistivity layer. The S/D feature also employs an effective stressor. The present disclosure also provides a crown-S/D feature structure for a FinFET device. The crown-S/D feature is not only equipped with the low resistivity layer and an effective stressor, but also strain booster by a larger volume of S/D feature. The present disclosure also provides a method employing formation of a sacrificial layer over the S/D feature to avoid adverse impacts due to subsequent etching process and also prevent layer segregation in the S/D feature.

The present disclosure provides many different embodiments of a semiconductor device. The semiconductor device includes a gate stack disposed over a substrate, a source/drain (S/D) feature at least partially embedded within the substrate adjacent the gate stack. The S/D feature includes a first semiconductor material layer, a second semiconductor material layer disposed over the first semiconductor material layer. The second semiconductor material layer is different to the first semiconductor material layer. The S/D also includes a third semiconductor material layer disposed over the second semiconductor material layer, which includes a tin (Sn) material.

In another embodiment, a FinFET device includes a substrate having multiple first isolation regions. The FinFET device also includes a common mesa and multiple fins between two adjacent first isolation regions. The FinFET device also includes a single source/drain (S/D) feature over the common mesa. The S/D feature includes a first semiconductor material layer over the recesses, a second semiconductor material layer over the first semiconductor material layer. The second semiconductor material layer is different semiconductor material to the first semiconductor material layer. The S/D feature also includes a third semiconductor material layer disposed over the second semiconductor material layer, which includes a tin (Sn) material. The device also includes multiple high-k/metal gate (HK/MG) stacks over respective fins, including wrapping over a portion of the fin, wherein the single S/D feature serves as a common S/D for the multiple HK/MG stacks.

In yet another embodiment, a method for fabricating a FinFET device includes forming a gate stack over a substrate, forming recesses at either side of the gate stack, forming a source/drain (S/D) features having a tin (Sn) based low resistivity layer, over recesses, forming a sacrificial layer over the S/D feature and replacing the gate stack with a high-k/metal gate (HK/MG).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a gate stack disposed over a substrate;
a source/drain (S/D) feature at least partially embedded within the substrate adjacent the gate stack, the feature including:
a first semiconductor material layer;
a second semiconductor material layer disposed over the first semiconductor material layer, wherein the second semiconductor material layer is a different semiconductor material than the first semiconductor material layer; and
a third semiconductor material layer disposed over the second semiconductor material layer, wherein the third semiconductor material layer includes a tin (Sn) material.

2. The device of claim 1, wherein the first semiconductor material layer is completely embedded in the substrate.

3. The device of claim 1, wherein the first semiconductor material layer physically contacts the second semiconductor material layer, and
wherein the third semiconductor material layer physically contacts the second semiconductor material layer.

4. The device of claim 1, wherein:
the first semiconductor material layer includes epitaxially grown silicon germanium ($SiGe_{x1}$), where $x_1$ is Ge composition in atomic percent;
the second semiconductor material layer includes semiconductor materials from the group consisting of epitaxially grown epitaxially grown silicon germanium ($SiGe_{x2}$) and epitaxially grown silicon germanium tin ($SiGe_{x3}Sn_y$), where $x_2$ and $x_3$ are Ge composition in atomic percent and y is Sn composition in atomic percent;
the third semiconductor material layer includes semiconductor materials from the group consisting of epitaxially grown germanium tin ($GeSn_z$), silicon germanium tin ($SiGeSn_z$), silicon germanium tin boron ($SiGeSn_zB$), and germanium tin boron ($GeSn_z$), where z is Sn composition in atomic percent;
a thickness of the first semiconductor material layer is in a range of about 5 nm to about 30 nm;
a thickness of the second semiconductor material layer is in a range of about 20 nm to about 60 nm; and
a thickness of the third semiconductor material layer is in a range of about 5 nm to about 30 nm.

5. The device of claim 4, wherein:
the $x_1$ in the first semiconductor material layer is substantial constant, which is in a range of about 10% to about 30%;
the $x_2$ in the second semiconductor material layer is substantial constant, which is in a range of about 30% to about 100%;
the $x_3$ in the second semiconductor material layer is in a range of about 85% to about 99%;
y in the second semiconductor material layer is in a range of about 1% to about 10%; and
the z in the third semiconductor material layer is in a range of about 1% to about 30%.

6. The device of claim 4, wherein the $x_1$ in the first semiconductor material layer is in a grading manner, which changes from about 10% to about 15% (from a bottom to a top of the first semiconductor material layer).

7. The device of claim 4, wherein the $x_2$ in the second semiconductor material layer is in a grading manner, which changes from about 35% to about 70% (from a bottom to a top of the first semiconductor material layer).

8. The device of claim 1, wherein the substrate includes silicon.

9. A fin-like field-effect transistor (FinFET) device comprising:
a substrate having multiple first isolation regions;
a common mesa and multiple fins between two adjacent first isolation regions;

a single source/drain (S/D) feature over the common mesa, the single S/D feature including:
- a first semiconductor material layer over the recesses;
- a second semiconductor material layer over the first semiconductor material layer, wherein the second semiconductor material layer is different semiconductor material to the first semiconductor material layer; and
- a third semiconductor material layer disposed over the second semiconductor material layer, wherein the third semiconductor material layer includes a tin (Sn) material; and multiple high-k/metal gate (HK/MG) stacks over respective fins, including wrapping over a portion of the fin, wherein the single S/D feature serves as a common S/D for the multiple HK/MG stacks.

10. The device of claim 9, wherein the first semiconductor material layer is completely embedded in the substrate.

11. The device of claim 10, wherein the first semiconductor material layer physically contacts the second semiconductor material layer, and
wherein the third semiconductor material layer physically contacts the second semiconductor material layer.

12. The device of claim 9, wherein:
- the first semiconductor material layer includes epitaxially grown silicon germanium ($SiGe_{x1}$), where $x_1$ is Ge composition in atomic percent;
- the second semiconductor material layer includes semiconductor materials from the group consisting of epitaxially grown epitaxially grown silicon germanium ($SiGe_{x2}$) and epitaxially grown silicon germanium tin ($SiGe_{x3}Sn_y$), where $x_2$ and $x_3$ are Ge composition in atomic percent and y is Sn composition in atomic percent;
- the third semiconductor material layer includes semiconductor materials from the group consisting of epitaxially grown germanium tin ($GeSn_z$), silicon germanium tin ($SiGeSn_1$), silicon germanium tin boron ($SiGeSn_zB$), and germanium tin boron ($GeSn_z$), where z is Sn composition in atomic percent;
- a thickness of the first semiconductor material layer is in a range of about 5 nm to about 30 nm;
- a thickness of the second semiconductor material layer is in a range of about 20 nm to about 60 nm; and
- a thickness of the third semiconductor material layer is in a range of about 5 nm to about 30 nm.

13. The device of claim 12, wherein:
- the $x_1$ in the first semiconductor material layer is substantial constant, which is in a range of about 10% to about 30%;
- the $x_2$ in the second semiconductor material layer is substantial constant, which is in a range of about 30% to about 100%;
- the $x_3$ in the second semiconductor material layer is in a range of about 85% to about 99%;
- the y in the second semiconductor material layer is in a range of about 1% to about 10%; and
- the z in the third semiconductor material layer is in a range of about 1% to about 30%.

14. The device of claim 12, wherein the $x_1$ in the first semiconductor material layer is in a grading manner, which changes from about 10% to about 15% (from a bottom to a top of the first semiconductor material layer).

15. The device of claim 12, wherein the $x_2$ in the second semiconductor material layer is in a grading manner, which changes from about 35% to about 70% (from a bottom to a top of the first semiconductor material layer).

16. The device of claim 9, further comprising:
a plurality of fins over the substrate, separated each other by second isolation regions, wherein the second isolation regions are between two adjacent first isolation regions, wherein the first isolation region are deeper than the second isolation region.

17. The device of claim 9, wherein the substrate includes silicon.

18. A fin-like field-effect transistor (FinFET) device comprising:
- a gate stack formed over a substrate;
- a source/drain (S/D) feature formed adjacent to the gate stack, the feature including a first semiconductor material layer;
- a second semiconductor material layer disposed over the first semiconductor material layer and in contact with the first semiconductor material layer, wherein the second semiconductor material layer is a different semiconductor material than the first semiconductor material layer; and
- a third semiconductor material layer disposed over the second semiconductor material layer and in contact with the second semiconductor material layer, wherein the third semiconductor material layer includes a tin (Sn) material.

19. The device of claim 18, wherein the first semiconductor material layer is completely embedded in the substrate.

20. The device of claim 18, wherein the first semiconductor material layer includes epitaxially grown silicon germanium ($SiGe_{x1}$), where $x_1$ is Ge composition in atomic percent,
wherein the second semiconductor material layer includes semiconductor materials from the group consisting of epitaxially grown epitaxially grown silicon germanium ($SiGe_{x2}$) and epitaxially grown silicon germanium tin ($SiGe_{x3}Sn_y$), where $x_2$ and $x_3$ are Ge composition in atomic percent and y is Sn composition in atomic percent,
wherein the third semiconductor material layer includes semiconductor materials from the group consisting of epitaxially grown germanium tin ($GeSn_z$), silicon germanium tin ($SiGeSn_z$), silicon germanium tin boron ($SiGeSn_zB$), and germanium tin boron ($GeSn_z$), where z is Sn composition in atomic percent.

* * * * *